United States Patent
Halbert et al.

(10) Patent No.: US 7,236,055 B2
(45) Date of Patent: Jun. 26, 2007

(54) DIFFERENTIAL AMPLIFIER CIRCUIT AND METHOD FOR REDUCING THERMALLY INDUCED OFFSETS CAUSED BY LARGE DIFFERENTIAL SIGNALS

(75) Inventors: Joel M. Halbert, Tucson, AZ (US); Ahmad Dashtestani, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 45 days.

(21) Appl. No.: 11/032,254

(22) Filed: Jan. 10, 2005

(65) Prior Publication Data

US 2006/0152282 A1 Jul. 13, 2006

(51) Int. Cl.
*H03F 3/45* (2006.01)

(52) U.S. Cl. .......................... 330/256; 330/289; 330/51

(58) Field of Classification Search ................. 330/256, 330/289
See application file for complete search history.

(56) References Cited

U.S. PATENT DOCUMENTS

| | | | | |
|---|---|---|---|---|
| 4,636,744 A | * | 1/1987 | King et al. ................. | 330/295 |
| 5,153,529 A | * | 10/1992 | Koda et al. ................. | 330/295 |
| 5,471,175 A | * | 11/1995 | Chiu et al. .................. | 330/298 |
| 6,316,995 B1 | * | 11/2001 | Chen et al. ................. | 330/252 |
| 6,384,679 B1 | * | 5/2002 | Lorenz ......................... | 330/51 |
| 6,498,534 B1 | * | 12/2002 | Kim et al. ................... | 330/136 |

* cited by examiner

*Primary Examiner*—Benny Lee
*Assistant Examiner*—Alan Wong
(74) *Attorney, Agent, or Firm*—Wade J. Brady, III; Frederick J. Telecky, Jr.

(57) ABSTRACT

An amplifier includes a differential amplifier (10) having an input stage (20) for amplifying a differential input signal (Vin), and an output stage (6) coupled to the input stage (20) for producing and output signal (Vout). The input stage (20) includes main input circuitry (20A) for amplifying small-signal values of the input signal (Vin) and alternative input circuitry (20B) for amplifying the input signal (Vin) during conditions which cause thermal imbalance in the main input circuitry (20B). The input stage (20) includes switching circuitry (12) for coupling the input signal (Vin) to the main input circuitry (20A) during normal small-signal operating conditions and to the alternative input circuitry (20A) during large-signal operating conditions that cause thermal imbalance in the main input circuitry (20B).

28 Claims, 8 Drawing Sheets

DIFFERENTIAL AMPLIFIER CIRCUIT AND METHOD FOR REDUCING THERMALLY INDUCED OFFSETS CAUSED BY LARGE DIFFERENTIAL SIGNALS

BACKGROUND OF THE INVENTION

The present invention relates generally to problems associated with differential thermal effects caused by steady-state or transient power imbalances in integrated circuit chips, and particularly to circuits and techniques for reducing the time required for recovery from such differential thermal effects.

It is well known that transient or steady-state large-signal input conditions can cause circuit operation that creates large power imbalances within an integrated circuit. In some cases, the integrated circuit must be operated so as to allow it sufficient time to "recover" from the large power imbalances before proper circuit operation can continue. The power imbalances can cause a temporary temperature imbalance that substantially changes the operating characteristics of circuit components such as transistors located in the region of the temperature imbalance. This may result in unacceptably inaccurate circuit performance until enough "recovery time" has elapsed to allow the temperature to be balanced within the region.

Various other conditions are known to cause similar imbalanced thermal conditions in integrated circuit chips. For example, large-signal slewing conditions or transient imbalances may cause recovery settling "tails" in the output response of a circuit. Input signal overdrive conditions beyond the linear range of an amplifier and its feedback loop may result in thermal imbalance conditions of long duration. Also, various special-purpose applications that cause linear feedback in an amplifier circuit to be interrupted or limited (e.g. in sample/hold amplifiers, peak detector circuits, and limiting/clamping amplifiers), can cause thermal imbalance conditions of the kind referred to above in. Although a thermal imbalance condition can occur due to simple transient slewing, it may be most problematic in applications in which a feedback loop is interrupted for a relatively long interval, for example in a sample/hold amplifier, a peak detector circuit, a limiting or clamping amplifier, or a multiplexed amplifier.

FIG. 1 shows a conventional closed loop feedback network that includes an operational amplifier 1 which receives a differential input signal Vin applied between a (−) input conductor 3 and a (+) input conductor 4. The input conductors 3 and 4 are connected to the inputs of a differential input transistor pair in circuitry 2A of an input stage 2 of amplifier 1. Input stage 2 typically also includes a folded cascode circuit, the output of which drives the high impedance compensation node 5 (i.e., "comp" node 5 of folded cascode stage 2A is connected to the input of a conventional output driver circuit 6A of an output stage 6. Output driver circuit 6A produces an output signal Vout on conductor 7, which is connected to the input of a feedback network 8 (which often is simply a feedback resistor). The output of feedback network 8 is connected to inverting input 3. FIG. 2 shows a schematic diagram of a conventional differential input circuit and folded cascode stage which can be used as input stage 2 of FIG. 1.

Referring to FIG. 2, Vin− is applied to the base of an NPN input transistor Q1, and Vin+ is applied to the base of an NPN input transistor Q2, the emitter of which is coupled by conductor 27 to the collector of an NPN current source transistor Q12. The emitter of transistor Q12 is coupled by a resistor R3 to a power supply voltage VEE. The emitter of input transistor Q1 is connected by conductor 26 to the collector of a current source transistor Q11, the emitter of which is coupled by a resistor R2 to VEE. A resistor R1 is connected between conductors 26 and 27. The bases of current source transistors Q11 and Q12 are connected to a bias voltage VB1 on conductor 22. The collector of input transistor Q1 is coupled by a conductor 24 to the emitter of a folded cascode PNP transistor Q6 and to one terminal of a resistor R5 coupled between conductor 24 and a power supply voltage VCC. Similarly, the collector of input transistor Q2 is coupled by a conductor 25 to the emitter of a folded cascode PNP transistor Q5 and to one terminal of a resistor R4 coupled between conductor 24 and VCC. The bases of cascode transistors Q5 and Q6 are connected to a bias voltage VB2 by conductor 28. Typically, the high impedance compensation or "comp" node of the entire circuit 2 is the collector of transistor Q6. In FIG. 2, the collector of transistor Q5 is coupled to an output of a current mirror 30. The collector of transistor Q6 is connected by conductor 5 to an input of current mirror 30. The voltage on conductor 5 is labeled Vcomp.

In the conventional closed loop feedback network of FIG. 1, the differential input error voltage is forced by the feedback loop to be nearly zero. Therefore, input stage 2 is driven to a balanced condition. Typical symmetrical construction of such circuitry on the integrated circuit chip and, along with the balanced operating condition due to the nearly-zero error voltage value of Vin, result in a thermally balanced condition of each of the power-dissipating circuit elements with respect to corresponding balanced components on the other side of the symmetrical construction.

However, if the differential input voltage Vin between the bases of transistors Q1 and Q2 is excessively large, then one of transistors Q1 and Q2 carries much more current than the other, and therefore dissipates much more than the normal amount of power and, therefore increases the temperature of that transistor. Computer analysis and laboratory measurements have shown that the increased temperature can result in significant thermally-induced offset voltages in transistors Q1, Q2, Q5 and Q6. The effect of this on the output voltage Vout (FIG. 1) appears as a delay in the waveform "A" shown in FIG. 6.

For example, if Vin+ is much larger than Vin−, then input transistor Q1 is turned off and dissipates no power, and a large current flows through input transistor Q2, causing it to dissipate a large amount of power. This results in substantially higher temperature in input transistor Q2 than in input transistor Q1, which can substantially change the operating characteristic of transistor Q2 relative to transistor Q1. After the above described Vin input "overdrive" condition ends, the feedback loop causes Vin=Vin+−Vin− to be essentially zero so the feedback loop is properly balanced, and an amount of time (i.e., the thermal recovery time or "tail") is required for the temperature of input transistor Q2 to recover to the temperature of input transistor Q1 so that the thermally sensitive circuitry including transistors Q1 and Q2 is balanced and the thermally-induced input offset voltage settles to a negligible value. Only then can a reliable precise value of Vout be obtained from the feedback amplifier. However, the thermal recovery time or "tail" shown in waveform "A" of FIG. 6 may be unacceptably long. Also, during the Vin overdrive condition the same current flowing through transistor Q2 is subtracted from the current flowing through cascode transistor Q5, which reduces the power dissipation in transistor Q5. This causes a thermal imbalance between cascode transistors Q5 and Q6.

Prior techniques are known for switching the amplifier signal path back and forth between separate differential input stages of a single operational amplifier. For example, the assignee's line of SWOP AMP operational amplifiers ("switchable op amps") uses this technique. However, the switching of the differential input stages therein is performed in response to a timed external signal, such as a clock signal or a control signal.

There appears to be no previously known practical solution to reducing the above described long thermal recovery "tails".

Thus, there is an unmet need for a circuit and technique for reducing or preventing transient or temporary power imbalances in an integrated circuit amplifier which cause transient inaccuracies in an output signal produced by the amplifier.

There also is an unmet need for a circuit and technique for reducing or preventing a transient or temporary power imbalance in a particular region of an integrated circuit amplifier which causes a thermal tail of a signal produced by the amplifier.

There also is an unmet need for a circuit and technique for reducing or preventing a transient or temporary power imbalance in a particular region of an integrated circuit amplifier due to an excessively large input signal.

There also is an unmet need for a circuit and technique for reducing or preventing a transient or temporary power imbalance in a particular region of an integrated circuit amplifier due to an interruption in a feedback loop in the amplifier.

There also is an unmet need for a circuit and technique for reducing or preventing a transient or temporary power imbalance in regions of both a differential input circuit amplifier and a folded cascode circuit in an integrated circuit due to an excessively large input signal.

There also is an unmet need for a circuit and technique for electrically detecting signal conditions which would cause transient or temporary thermal imbalances in an integrated circuit without relying on system timing or control signals.

SUMMARY OF THE INVENTION

It is an object of the invention to provide a circuit and technique for reducing or preventing transient or temporary power imbalances in an integrated circuit amplifier which cause transient inaccuracies in an output signal produced by the amplifier.

It is an object of the invention to provide a circuit and technique for reducing or preventing a transient or temporary power imbalance in a particular region of an integrated circuit amplifier which cause a thermal tail of a signal produced by the amplifier.

It is an object of the invention to provide a circuit and technique for reducing or preventing a transient or temporary power imbalance in a particular region of an integrated circuit amplifier due to an excessively large input signal.

It is an object of the invention to provide a circuit and technique for reducing or preventing a transient or temporary power imbalance in a particular region of an integrated circuit amplifier due to an interruption in a feedback loop of the amplifier.

It is an object of the invention to provide a circuit and technique for reducing or preventing a transient or temporary power imbalance in the regions of a differential input circuit and/or a folded cascode circuit in an integrated circuit amplifier due to an excessively large input signal.

It is another object of the invention to provide a control signal within an integrated circuit amplifier that indicates whether the value of an input signal of the amplifier is within a predetermined range solely in response to that input signal and utilize that control signal to prevent transient or temporary power imbalances in the integrated circuit amplifier due to out-of-range values of the input signal.

It is another object of the invention to provide a circuit and technique for electrically detecting signal conditions which would cause transient or temporary thermal imbalances in an integrated circuit without relying on system timing or control signals.

It is another object of the invention to provide a circuit and technique for reducing or preventing transient or temporary thermal imbalances in an integrated circuit amplifier which would cause transient inaccuracies in an output signal produced by the amplifier and which is easily extendable to multiple signal processing stages of the amplifier.

Briefly described, and in accordance with one embodiment, the present invention provides an amplifier including a differential amplifier (10) having an input stage (20) for amplifying a differential input signal (Vin), and an output stage (6) coupled to the input stage (20) for producing an output signal (Vout). The input stage (20) includes main input circuitry (20A) for amlifying small-signal values of the input signal (Vin) and alternative input circuitry (20B) for amplifying the input signal (Vin) during conditions which cause thermal imbalance in the main input circuitry (20A). The input stage (20) includes switching circuitry (22) for coupling the input signal (Vin) to the main input circuitry (20A) during normal small-signal operating conditions and to the alternative input circuitry (20B) during conditions which cause thermal imbalance in the main input circuitry (20A).

In a described embodiment, the input stage (20) includes main input circuitry (20A) including a first portion (e.g., Q1,2,11,12 or Q5,6,15,16) of the first stage (200A) for amplifying the relatively small-value signals in the signal path of the differential input signal (Vin), and also includes alternative input circuitry (20B) including a second portion (e.g., Q3,4,13,14 or Q7,8,15,16) of the first stage (200A) for amplifying the relatively large-value signals in the signal path of the differential input signal (Vin) which if amplified by the main input circuitry (20A) would cause thermal imbalance in the main input circuitry (20A). The input stage (20) also includes switching circuitry (12) for selectively coupling signals in the signal path of the differential input signal (Vin) to the first portion (Q1,2,11,12) of the first stage (200A) or the second portion (Q3,4,13,14) of the first stage (200A), and also includes detection circuitry (60) coupled to receive signals in the signal path of the differential input signal (Vin). The detection circuitry (60) is coupled to the first portion (Q1,2,11,12) of the first stage (200A) to cause the first portion (Q1,2,11,12) of the first stage (200A) to amplify signals in the signal path of the differential input signal (Vin) during small-signal operating conditions, and also is coupled to the second portion (Q3,4,13,14) of the first stage (200A) to cause the second portion (Q3,4,13,14) of the first stage (200A) to amplify signals in the signal path of the differential input signal (Vin) during large-signal operating conditions to reduce thermal imbalance in the main input circuitry (20A). The input stage (20) also can include a second stage (200B) coupled in the path of the differential input signal (Vin), wherein the main circuitry (20A) includes a first portion (e.g., Q5,6,15,16) of the second stage (200B) for amplifying relatively small-value signals in the signal path of the differential input signal (Vin), wherein the alternative circuitry (20B) includes a second portion (e.g., Q7,8,15,16) of the second stage (200B) for amplifying relatively large-value signals in the signal path of the differential input signal (Vin). The detection circuitry (60) is coupled to the first portion (e.g., Q5,6,15,16) of the second stage (200B) to cause the first portion (e.g., Q5,6,15,16) of the second stage (200B) to amplify signals in the signal path of the differential input signal (Vin) during small-signal operating conditions, and also is coupled to the second portion (e.g., Q7,8,15,16) of the second stage (200B) to cause the second portion (e.g., Q7,8,15,16) of the second stage (200B) to amplify signals in the signal path of the differential input signal (Vin) during large-signal operating conditions to further reduce thermal imbalance in the main input circuitry (20A). In the described embodiment, the first stage (200A) includes a differential cascode stage coupled to receive signals in the signal path of the differential input signal (Vin), and the second stage (200B) includes a differential cascode stage coupled to receive signals in the signal path of the differential input signal (Vin). The differential input signal (Vin) can be equal to the difference between first (Vin+) and second (Vin−) time-varying signals, or can be equal to the difference between a first time-varying signal (e.g., Vin+) and a fixed reference signal (e.g., ground).

In the described embodiment, the detection circuitry (60) is operative to produce a first control signal (VBmain) indicative of when the differential input signal (Vin) is a relatively small-value signal for controlling the first portion (Q1,2,11,12) of the first stage (200A) and a second control signal (VBalt) indicative of when the differential input signal (Vin) is a relatively large-value signal for controlling the second portion (Q3,4,13,14) of the first stage (200A). The switching circuitry (12) also decouples the input signal (Vin) from a first one of the main input circuitry (20A) and the alternative input circuitry (20B) while coupling the input signal (Vin) to the other of the main input circuitry (20A) and the alternative input circuitry (20B).

In the described embodiment, the input stage (20) includes a switched differential amplifier section including first (Q1), second (Q2), third (Q3) and fourth (Q4) input transistors, and first (Q11), second (Q12), third (Q13) and fourth (Q14) switching transistors. The collectors of the first (Q1) and third (Q3) input transistors are coupled by a first conductor (32) to a first terminal of a first load device (R5), collectors of the second (Q2) and fourth (Q4) are coupled by a second conductor (33) to a first terminal of a second load device (R4), bases of the first (Q1) and third (Q3) input transistors are coupled to a first input signal (Vin−), bases of the second (Q2) and fourth (Q4) input transistors are coupled to a second input signal (Vin+). An emitter of the first input transistor (Q1) are coupled by a first diode (D1) to a collector of the first switching transistor (Q11), an emitter of the second input transistor (Q2) are coupled by a second diode (D2) to a collector of the second switching transistor (Q12), an emitter of the third input transistor (Q3) are coupled by a third diode (D3) to a collector of the third switching transistor (Q13), an emitter of the fourth input transistor (Q4) are coupled by a fourth diode (D4) to a collector of the fourth switching transistor (Q14), emitters of the first (Q11) and third (Q13) switching transistors are coupled to a first terminal of a first current source (R2), and emitters of the second (Q12) and fourth (Q14) switching transistors are coupled to a first terminal of a second current source (R3). A first emitter degeneration resistor (R1) are coupled between the emitters of the first (Q1) and second (Q2) input transistors, a second emitter degeneration resistor (R6) are coupled between the emitters of the third (Q3) and fourth (Q4) input transistors. Bases of the first (Q11), second (Q12), third (Q13) and fourth (Q14) switching transistors are coupled to the switching circuitry (12). The first emitter degeneration resistor (R1) is coupled between cathodes of the first (D1) and second (D2) diodes and between collectors of the first (Q11) and second (Q12) switching transistors, and the second emitter degeneration resistor (R6) is coupled between cathodes of the third (D3) and fourth (D4) diodes and between the collectors of the third (Q13) and fourth (Q14) switching transistors. A first resistor (R10) is coupled between an anode of the first diode (D1) and the cathode of the third diode (D3). A second resistor (R11) is coupled between an anode of the second diode (D2) and the cathode of the fourth diode (D4). The bases of the first, second, third, and fourth switching transistors are coupled to the switching circuitry (12) to turn the first (Q11) and second (Q12) switching transistors on during the normal small-signal operating conditions and to turn the third (Q13) and fourth (Q14) switching transistors on during the condition which causes the thermal imbalance. The detection circuitry (60) is operative to produce a first control signal (VBmain) indicative of when the differential input signal (Vin) is a relatively small-value signal for controlling the first portion (Q1,2,11, 12) of the first stage (200A) and a second control signal (VBalt) indicative of when the differential input signal (Vin) is a relatively large-value signal for controlling the second portion (Q3,4,13,14) of the first stage (200A), the first control signal (VBmain) being coupled to the bases of the first (Q11) and second (Q12) switching transistors, the second control signal (VBalt) being coupled to the bases of the third (Q13) and fourth (Q14) switching transistors.

In the described embodiment, the input stage (20) includes a switched folded cascode section including a first main cascode transistor (Q5) having a collector coupled to an output of a current mirror (30) and a base coupled to the switching circuitry (12), a second main cascode transistor (Q6) having a collector coupled to an input of the current mirror (30) and a base coupled to the switching circuitry (12), a first alternate cascode transistor (Q7) having a collector coupled to the collector of the first main cascode transistor (Q5) and a base coupled to the switching circuitry (12), and a second alternate cascode transistor (Q8) having a collector coupled to the collector of the second main cascode transistor Q6) and a base coupled to the switching circuitry (12). The collector of the first main cascode transistor (Q5) is coupled to the output of the current mirror (30) by means of a first series cascode transistor (Q9) and the collector of the second main cascode transistor Q6) is coupled to the input of the current mirror (30) by means of a second series cascode transistor (Q10). The bases of the first (Q5) and second (Q6) main cascode transistors are coupled to the switching circuitry (12) to turn them on during the small-signal operating conditions and wherein bases of the first (Q7) and second (Q8) alternative cascode transistors are coupled to the switching circuitry (12) to turn them on during the large-signal operating conditions.

In the described embodiment, the detection circuitry (60) includes a first detector input stage including a first detector input transistor (Q30) having a first terminal coupled to a first current source (I1), a control terminal coupled to a first input conductor (4), and a second terminal coupled to a first conductor (47), a second detector input transistor (Q17) having a first terminal coupled to a first terminal of a first detector diode (D6) having a second terminal coupled to the first current source (I1), a control terminal coupled to a second input conductor (3), and a second terminal coupled to a second conductor (48). A second detector input stage includes a third detector input transistor (Q31) having a first terminal coupled to a second current source (I2), a control terminal coupled to the second input conductor (3), and a second terminal coupled to the first conductor (47), a fourth detector input transistor (Q18) having a first terminal coupled to a first terminal of a second detector diode (D7) having a second terminal coupled to the second current source (I2), a control terminal coupled to the first input conductor (4), and a second terminal coupled to the second conductor (48). A detector output stage includes a third current source (I3) coupled to the first conductor (47), a first detector resistor (R15) having a first terminal coupled to the second conductor (48) and a second terminal coupled to a reference voltage source (VB1), and a second detector resistor (R15) having a first terminal coupled to the first conductor (47) and a second terminal coupled to the reference voltage source (VB1), the first conductor (47) being coupled to the first portion (Q1,2,11,12) of the first stage (200A) and conducting a signal (VBmain) for indicating that the differential input signal (Vin) has a small-signal value, the second conductor (48) being coupled to the second portion of the first stage (200A and conducting a signal (VBalt) for indicating that the differential input signal (Vin) has a large-signal value. The input stage (20) also includes a switched folded cascode section including a first main cascode transistor (Q5) having a collector coupled to an output of a current mirror (30) and a base coupled to the switching circuitry (12), a second main cascode transistor (Q6) having a collector coupled to an input of the current mirror (30) and a base coupled to the switching circuitry (12), a first alternate cascode transistor (Q7) having a collector coupled to the collector of the first main cascode transistor (Q5) and a base coupled to the switching circuitry (12), and a second alternate cascode transistor (Q8) having a collector coupled to the collector of the second main cascode transistor (Q6) and a base coupled to the switching circuitry (12). The collector of the first main cascode transistor (Q5) is coupled to the output of the current mirror (30) by means of a first series cascode transistor (Q9) and the collector of the second main cascode transistor (Q6) is coupled to the input of the current mirror (30) by means of a second series cascode transistor (Q10).

DETAILED DESCRIPTION OF THE PREFERRED EMBODIMENTS

The present invention provides a circuit and technique which can mitigate or nearly eliminate the above-mentioned output signal recovery tails that result from thermal imbalances in an integrated circuit amplifier caused by large-signal inputs, large-signal internal operating conditions and/or interruptions of a feedback loop.

Figure 3:
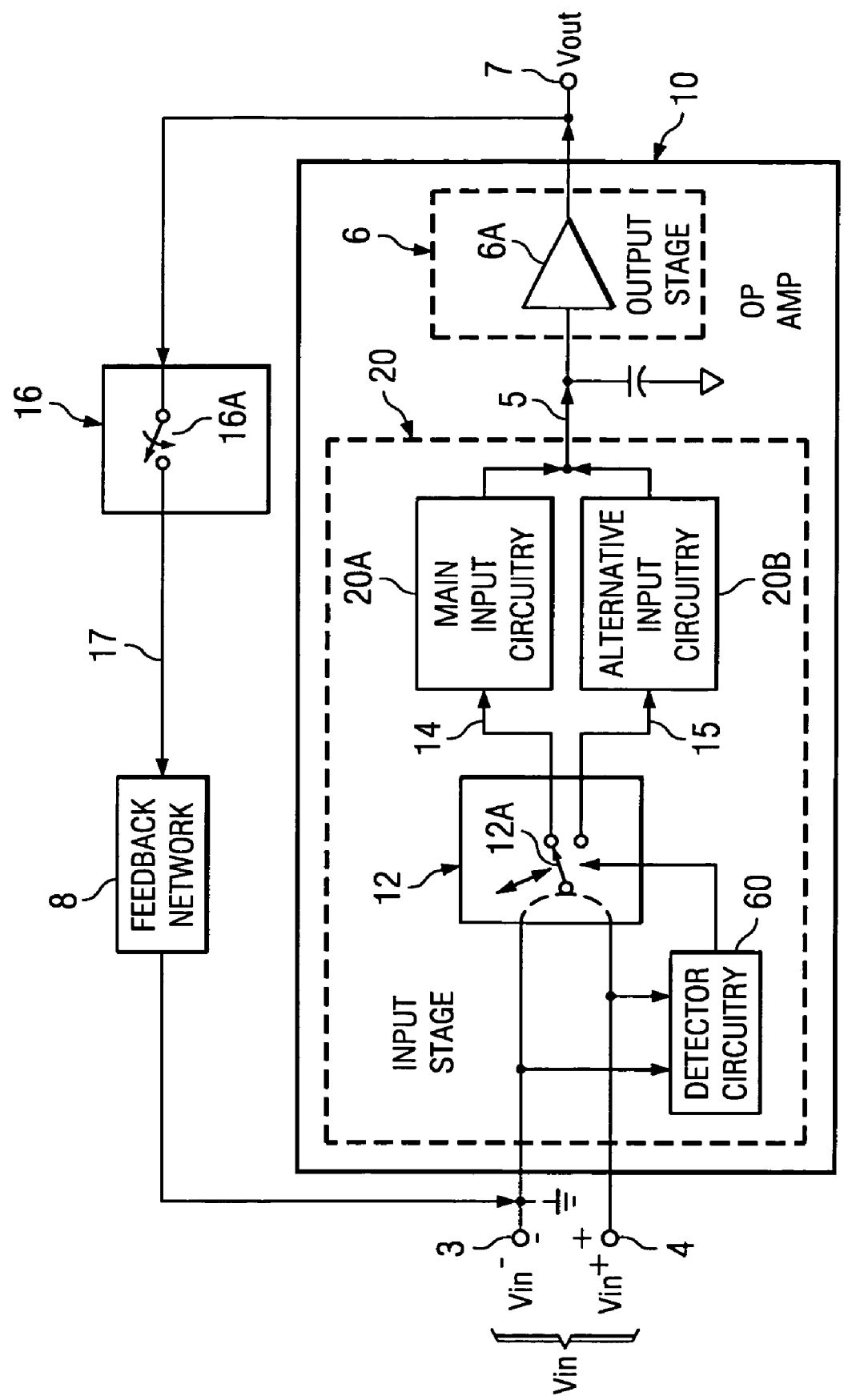
FIG. 3 is a block diagram of a preferred embodiment of the present invention.

FIG. 3 shows a block diagram of a feedback amplifier including an operational amplifier 10 which includes a switched input stage 20 according to the present invention, and also includes a conventional output stage 6. The input signal Vin=Vin+−Vin− is applied between input conductors 3 and 4 of switching circuitry that is "conceptually" illustrated in block 12. Switching circuitry 12, in effect, applies Vin either via a signal path 14 to the input of main input circuitry 20A or via a signal path 15 to the input of alternative input circuitry 20B. Switching circuitry 12 also can be coupled to main input circuitry and alternative input circuitry in various other parts of operational amplifier 10, for example, in PNP cascode transistors Q5 and Q6 of input stage 20 in section 200B of subsequently described FIG. 4, output circuitry 6A, and/or any other circuitry in which thermal imbalance occurs due to variable signal conditions or other variable conditions and causes troublesome accuracy problems.

Conceptually, a switching circuit or element 12A in block 12 illustrates the switching of Vin through one or the other of main input circuitry 20A or alternative input circuitry 20B. The outputs of main input circuitry 20A and alternative input circuitry 20B both are connected to comp node conductor 5, which is connected to the input of an output amplifier or buffer circuit 6A of output stage 6. Switching circuit/element 12A is controlled by a detector circuit 60, the inputs of which are connected to Vin. Detector circuit 60 detects whether Vin presently is at a normal or low-level signal value or is at an excessively high-level signal value which may cause troublesome thermal imbalances of the kind mentioned above. Output circuit 6A produces Vout on conductor 7, which is applied to an input of block 16. It should be appreciated that some or all of the switching circuitry conceptually indicated as being in block 12 of FIG. 3 could be included in either or both of main input circuitry 20A and alternative input circuitry 20B.

Note that the total amount of power dissipation in input stage 20 is not necessarily changed when Vin is switched from main input circuitry 20A to alternative input circuitry 20B during large-signal operating conditions. Instead, the high amount of power dissipation and associated power imbalance caused by a large-signal value of Vin is shifted from main input circuitry 20A to alternative input circuitry 20B. Therefore, the main signal path of Vin through main input circuitry 20A for small-signal operation is unaffected by the thermal imbalances caused by large-signal values of Vin.

Block 16 in FIG. 3 conceptually represents a possible interruption in the feedback loop including feedback network 8. An example of such an interruption is disclosed in commonly assigned patent application Ser. No. 10/609,209 entitled "Output Stage, Amplifier and Associated Method for Limiting and Amplifier Output", filed Jun. 27, 2003, and incorporated herein by reference. The above-mentioned patent application describes the kind of interruption represented by block 16 in the feedback loop of FIG. 3, which occurs as a result of switching between alternative output stages to suitably limit the range of the output signal. While the feedback loop is interrupted the feedback to inverting input conductor 3 is meaningless. Although the circuitry described in the foregoing patent application has the thermal tail recovery problem previously described herein, it does not suggest any solution to that problem.

The output of block 16 is coupled by conductor 17 to the input of feedback network 8 (which often is simply a feedback resistor). The output of feedback network 8 is connected to the inverting input 3 of amplifier 10. (Note that block 16 in FIG. 3 does not actually represent a physical switch circuit, and instead represents the existence of an interruption or discontinuity of the feedback loop through operational amplifier 10 and feedback network 8.) When the feedback loop is closed, amplifier 10 has very high gain and therefore tries to force Vin to zero. But if the feedback loop is interrupted, then even a very minute value of Vin causes Vout to swing to either a maximum or minimum rail voltage, which ordinarily would cause a thermal imbalance leading to a thermal recovery tail as shown by waveform "A" in FIG. 6 (without the benefit of alternative input circuitry 20B and associated switching circuitry of the present invention).

Computer simulations have shown that the main contributors to thermal imbalance that causes a long thermal recovery due to thermally induced input offset voltages are associated with input transistors Q1 and Q2 and cascode transistors Q5 and Q6. (The computer simulations also indicate, but to a much lesser extent, that there also may be thermally induced offset voltages associated with the current mirror 30 of subsequently described FIG. 4.) Specifically, the simulations showed that the thermal imbalance effects on the operational amplifier 10 were approximately 30 percent for the differential input stage, approximately 65 percent for the cascode transistors, and approximately 5 percent for the rest of operational amplifier 10.

Figure 4:
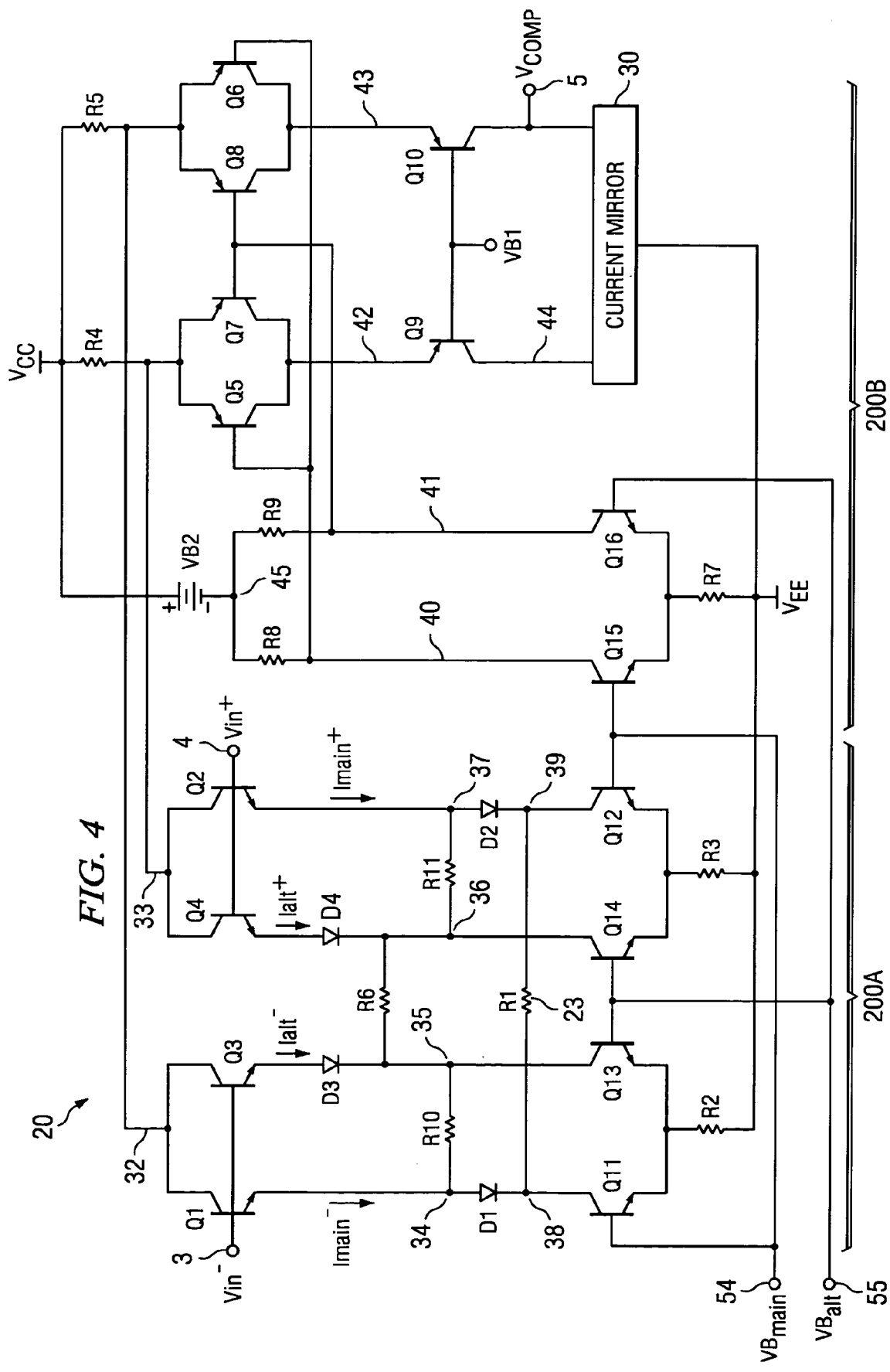
FIG. 4 is a basic schematic diagram of the folded cascode input stage 20 of FIG. 3 including separate selectable stages in the input signal path for separately handling small-value and large-value signals in the input signal path.

FIG. 4 is a basic schematic diagram of the folded cascode input stage 20 of FIG. 3, including the separate small-signal-handling main input circuitry 20A and large-signal-handling alternative input circuitry 20B. Referring to FIG. 4, folded cascode input stage 20 includes switched differential input circuitry 200A and switched folded cascode circuitry 200B. Switched differential input circuitry 200A includes NPN input transistors Q1, Q2, Q3 and Q4, diodes D1, D2, D3 and D4, and NPN switched current source transistors Q11, Q12, Q13, and Q14. Vin+ is connected to the bases of input transistors Q2 and Q4, and Vin− is connected to the bases of input transistors Q1 and Q3, Vin being equal to Vin+ minus Vin−. The collectors of input transistors Q1 and Q3 are connected by conductor 32 to one input of switched folded cascode circuitry 200B, and the collectors of input transistors Q2 and Q4 are connected by conductor 33 to another input of switched folded cascode circuit 200B.

The emitter of input transistor Q1 is connected by conductor 34 to the anode of a diode D1 and to one terminal of a resistor R10, the other terminal of which is connected to a conductor 35. The cathode of diode D1 is connected by a conductor 38 to the collector of NPN switched current source transistor Q11, the emitter of which is connected to one terminal of a current source or resistor R2. The other terminal of resistor R2 is connected to VEE. Conductor 38 also is connected to one terminal of a resistor R1, the other terminal of which is connected to a conductor 39. Similarly, the emitter of transistor Q3 is connected to the anode of diode D3, the cathode of which is connected by conductor 35 to one terminal of a resistor R6, the other terminal of which is connected to a conductor 36. Conductor 35 is also connected to the collector of NPN switched current source transistor Q13, the emitter of which is connected to the emitter of switched current source transistor Q11.

The base of switched current source transistor Q11 is connected by conductor 54 to a control signal VBmain, and the base of switched current source transistor Q13 is connected by conductor 55 to a control signal VBalt. The emitter of input transistor Q2 is connected by a conductor 37 to one terminal of a resistor R11, the other terminal of which is connected to conductor 36. Conductor 37 also is connected to the anode of diode D2, the cathode of which is connected to conductor 39. Conductor 39 is connected to the collector of NPN switched current source transistor Q12, which has its base connected by conductor 54 to VBmain. The emitter of input transistor Q4 is connected to the anode of diode D4 which has its cathode connected by conductor 36 to the collector of NPN switched current source transistor Q14, which has its emitter connected to the emitter of switched current source transistor Q12 and to one terminal of a current source or resistor R3 having its other terminal connected to VEE.

Thus, section 200A of input stage 20 amplifies differential input signal Vin by means of input transistors Q1 and Q2 of main input circuitry 20A in response to VBmain during small-signal operating conditions, and amplifies differential input signal Vin by means of input transistors Q3 and Q4 of alternative input circuitry 20B in response to VBalt during large-signal operating conditions. The large amount of power dissipated during large-signal operating conditions is thereby shifted from input transistor Q1 or Q2 of main input circuitry 20A to either alternative input transistor Q3 or Q4 of alternative input circuitry 20B during large-signal operating conditions, and therefore does not cause a thermal imbalance between main input transistors Q1 and Q2, and therefore does not generate a thermally induced offset between them.

Switched folded cascode circuitry 200B includes PNP switched folded cascode transistors Q5, Q6, Q7, and Q8, differentially coupled NPN switching transistors Q15 and Q16, and PNP cascode transistors Q9 and Q10. The base of switching transistor Q15 is connected to VBmain, and its emitter is connected to the emitter of switching transistor Q16 and to one terminal of a current source or resistor R7 having its other terminal connected to VEE. The base of switching transistor Q16 is connected to Vbalt. The collector of switching transistor Q15 is connected by a conductor 40 to one terminal of a load resistor R8 having its other terminal connected by conductor 45 to the (−) terminal of a voltage level shift circuit VB2, the (+) terminal of which is connected to VCC. Similarly, the collector of switching transistor Q16 is connected by a conductor 41 to one terminal of a load resistor R9, the other terminal of which is connected to conductor 45.

Conductor 40 also is connected to the bases of switched cascode transistors Q5 and Q6. Conductor 41 is connected to the bases of switched cascode transistors Q7 and Q8. The emitters of switched cascode transistors Q5 and Q7 are connected to conductor 33, which is connected to to one terminal of a load resistor R4, the other terminal of which is connected to VCC. Similarly, the emitters of switched cascode transistors Q8 and Q6 are connected by conductor 32 to one terminal of a load resistor R5, the other terminal of which is connected to VCC. The collectors of switched cascode transistors Q5 and Q7 are connected by conductor 42 to the emitter of cascode transistor Q9, the collector of which is connected by conductor 44 to an output of a current mirror circuit 30. Similarly, the collectors of switched cascode transistors Q8 and Q6 are connected by conductor 43 to the emitter of cascode transistor Q10, the collector of which is connected by conductor 5 to Vcomp and to an input of current mirror circuit 30. The bases of cascode transistors Q9 and Q10 are connected to a bias voltage VB1.

Switched cascode transistors Q5 and Q6 are included in main input circuitry 20A (FIG. 3), and are turned on in response to VBmain during small-signal operating conditions. Switched cascode transistors Q7 and Q8 are included in alternative input circuitry 20B (FIG. 3), and are turned on in response to VBalt during large-signal operating conditions. Additional series cascode transistors Q9 and Q10 function to reduce additional offset that would be caused if the collector-emitter voltages of transistors Q5 and Q6 are not equal, which is what would occur during circuit operation if series cascode transistors Q9 and Q10 were to be omitted and instead conductors 42 and 43 were to be connected to conductors 44 and 5, respectively. This would occur irrespective of the switching of power from main input transistors Q5 and Q6 to alternative input transistors Q7 and Q8, because during circuit operation the voltage of conductor 44 is essentially constant (at the current mirror input voltage) while Vcomp on conductor 5 may have a wide range of values. Large values of Vcomp would cause a significant offset between main input transistors Q5 and Q6 even if the Vin signal path has been switched to alternative input transistors Q7 and Q8 during large-signal operating conditions, unless series cascode transistors Q9 and Q10 are provided as shown.

Thus, section 200B of input stage 20 further amplifies differential input signal Vin by means of cascode transistors Q5 and Q6 of main input circuitry 20A in response to VBmain during small-signal operating conditions, and further amplifies differential input signal Vin by means of cascode transistors Q7 and Q8 of alternative input circuitry 20B in response to VBalt during large-signal operating conditions. The large amount of power dissipated during large-signal operating conditions is thereby shifted from cascode transistor Q5 or Q6 of main input circuitry 20A to either alternative cascode transistor Q7 or Q8 of alternative input circuitry 20B during large-signal operating conditions, and therefore does not cause a thermal imbalance between main cascode transistors Q5 and Q6, and therefore does not generate a thermally induced offset between them.

Figure 2:
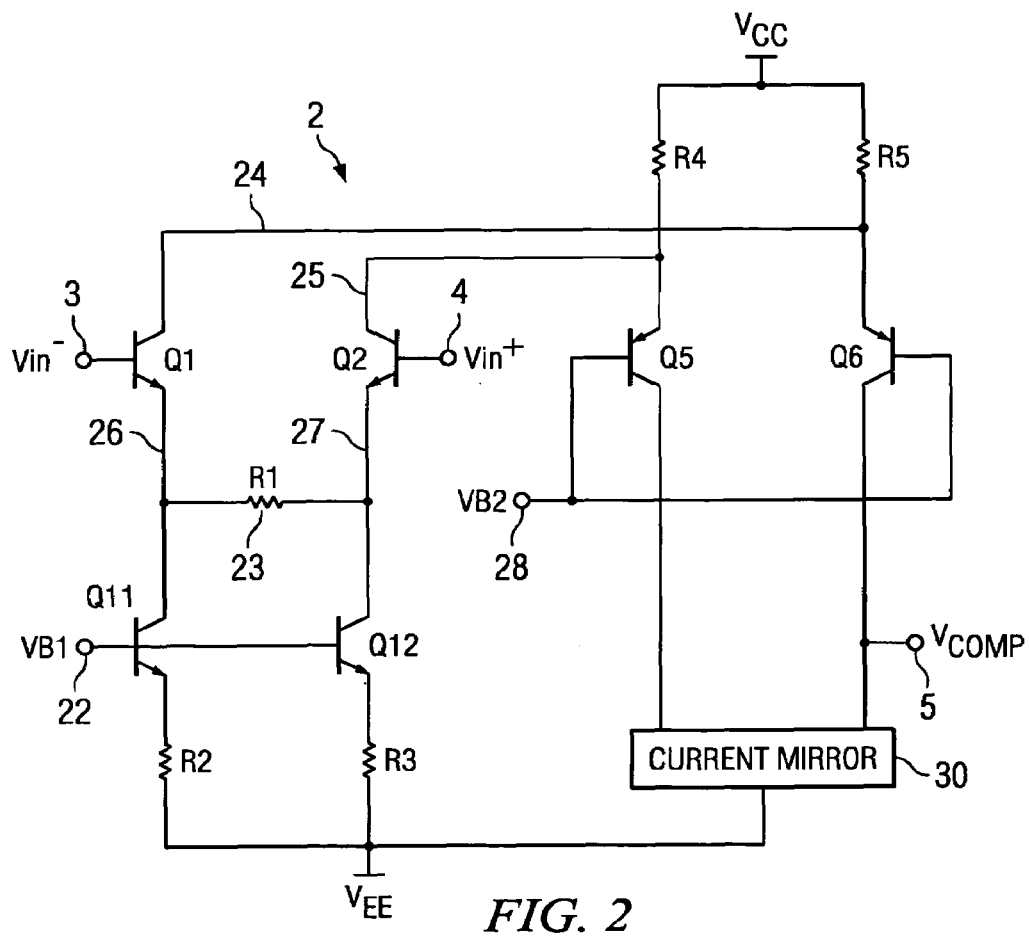
FIG. 2 is a schematic diagram of the folded cascode input stage of the feedback amplifier of FIG. 1.

Note that transistors Q1, Q2, Q11, Q12, Q5, and Q6 in FIG. 4 are the same as in the conventional folded cascode circuit shown in FIG. 2, and are included in main input circuitry 20A in FIG. 3. During normal or small-signal mode of operation, the foregoing transistors perform the signal "differencing" and the "gain" functions of input stage 20. Transistors Q3, Q4, Q13, Q14, Q7, and Q8 are included in alternative input circuitry 20B of input stage 20 of FIG. 3.

It should be appreciated that the circuitry in FIG. 4 can be implemented without diodes D1–4. Resistors R1 and R6 are emitter degeneration resistors for differential transistor pairs Q1,2 and Q3,4, respectively, and typically have a resistance of approximately 300 ohms, so as to degenerate and linearize the amplification. Resistors R10 and R11 are very large-value resistors, typically 50 to 100 kilohms, and may be omitted because they merely function to prevent conductors 34, 35, 36 and 37 from floating to indeterminant voltage levels and thereby result in smoother transitions when the signal path of Vin is switched between main input circuitry 20A and alternative input circuitry 20B.

Figure 8:
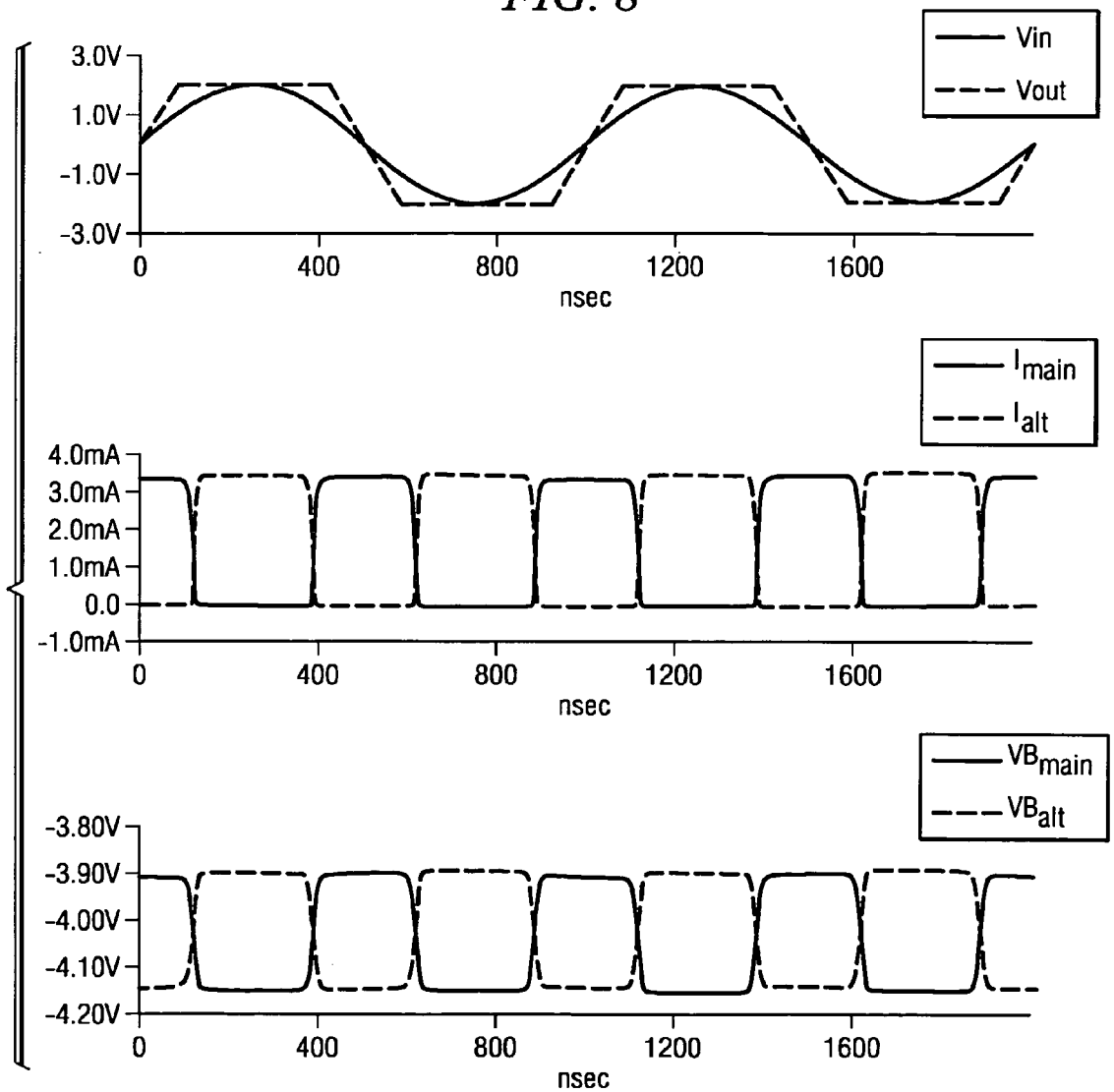
FIG. 8 is a diagram showing waveforms of Vin and Vout for the circuit of FIG. 4 under large-signal conditions which cause switching of the folded cascode input stage.

This is significant because the transitions wherein the signal path of Vin is switched between main input circuitry 20A and alternative input circuitry 20B should be smooth to provide low amplifier signal distortion. The switching waveforms in FIG. 8 are for the case wherein the values of Vin exceed the large-signal threshold. If the horizontal scale in FIG. 8 is amplified, relatively linear portions that represent a fairly smooth transition between main input circuitry 20A and alternative input circuitry 20B can be easily recognized. For example, if the differential input signal Vin is incremented in small steps, a point can be found at which main input circuitry 20A and alternative input circuitry 20B are equally on and contribute equally to Vout. That is, the switching circuitry 12 can be designed to have a suitable amount of gain in order to provide the needed level of smoothness in the transition in which the signal path of Vin is switched between main input circuitry 20A and alternative input circuitry 20B.

The purpose of diodes D1–4 in FIG. 4 is to protect transistors Q1–4 if they are turned off when there large voltages across them, so as to, in effect, increase their breakdown voltages and at the same time add to the emitter degeneration resistances for transistors Q1–4. The resistances of resistors R10 and R11 are so large that they conduct practically no current but nevertheless prevent conductors 34, 35, 36 and 37 from electrically floating when transistors Q1–4 are off. This results in smoother switching between main circuitry 20A and alternative input circuitry 20B. Although a preferred embodiment of the invention is shown in FIG. 4, it should be appreciated that differential input stage 200A can be simplified by omitting diodes D1–4 and resistors R10 and R11, so resistor R6 is the degeneration resistor associated with transistors Q3 and Q4, and resistor R1 is the degeneration resistor associated with transistors Q1 and Q2.

There may be various practical methods for detecting the presence or absence of large-signal conditions in the circuit of FIG. 4 and accordingly switching the amplifier signal path of Vin to one or the other of main input circuitry 20A and alternative input circuitry 20B. The switching is controlled by means of the two control signals VBmain and VBalt. During small-signal operation, VBmain is at a higher voltage, causing Vin to be amplified by main input circuitry 20A. However, during large-signal operation, VBalt is at a higher voltage than VBmain, which causes alternative input circuitry 20B to "take over" the amplification of Vin and causes main input stage 20A to shut down and therefore remain thermally balanced. Consequently, a much shorter thermal tail recovery time is required when Vin is switched back to the input of main input circuitry 20A.

Figure 5:
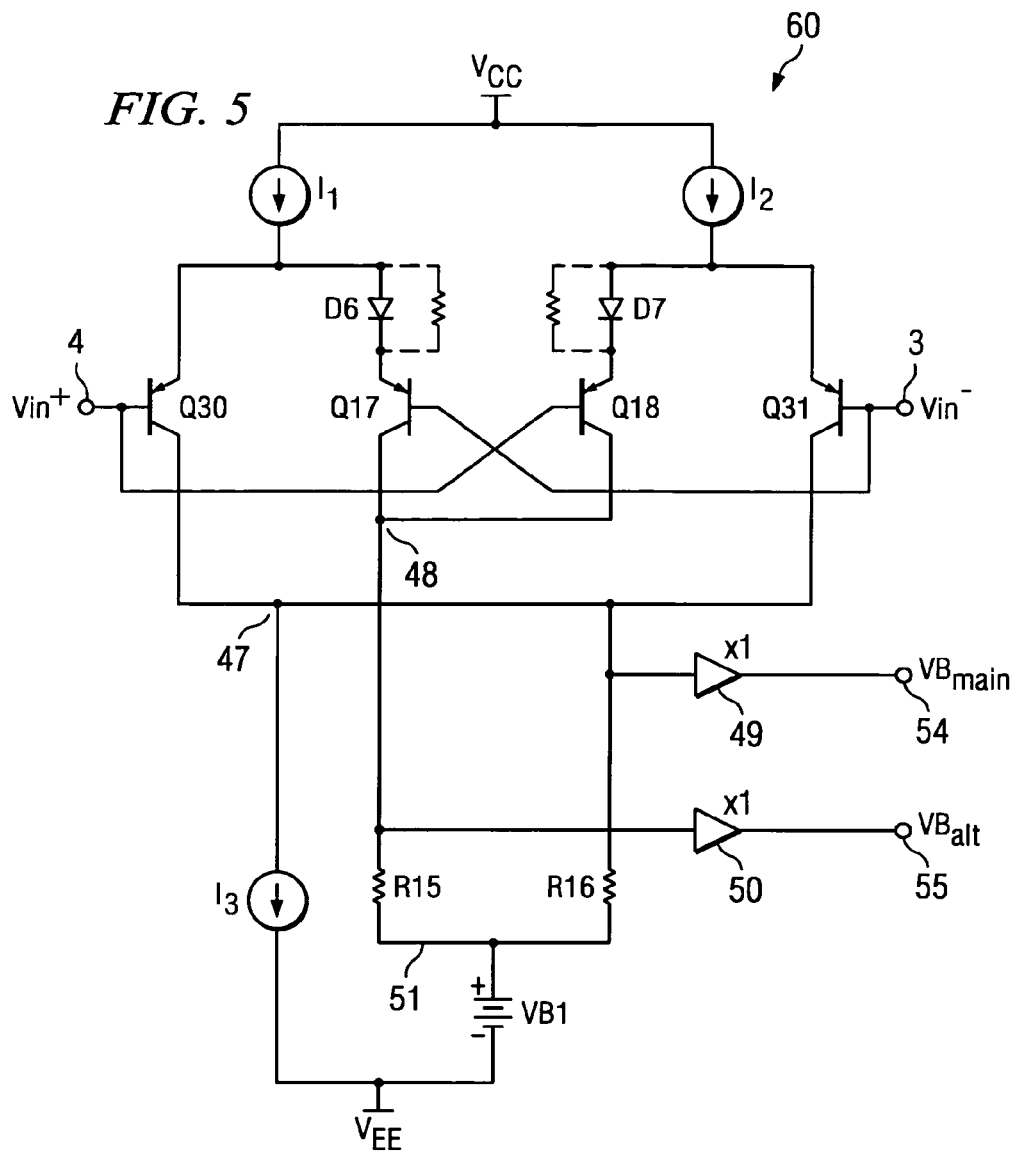
FIG. 5 is a schematic diagram illustrating a circuit for generating the switching control signals VBmain and VBalt in FIG. 4.

FIG. 5 shows a circuit that is used to generate the above-mentioned control signals VBmain and VBalt directly from the differential input signal Vin. Referring to FIG. 5, detector circuit 60 includes PNP input transistors Q30, Q31, Q17, and Q18 and diodes D6 and D7. Vin+ is connected by conductor 4 to the bases of transistors Q30 and Q18. Similarly, Vin– is connected by conductor 3 to the bases of transistors Q31 and Q17. The emitter of transistor Q30 is connected to a tail current source I1, which is also coupled to the anode of diode D6, the cathode of which is connected to the emitter of transistor Q17. The emitter of transistor Q31 is connected to another tail current source I2, which is also connected to the anode of diode D7, the cathode of which is connected to the emitter of transistor Q18. (Diodes D6 and D7 may be low-voltage Schottky diodes.) The collectors of transistors Q17 and Q18 are connected by conductor 48 to the input of a unity gain buffer 50 and to one terminal of a load resistor R15, the other terminal of which is connected to conductor 51. Similarly, the collectors of transistors Q30 and Q31 are connected by conductor 47 to the input of a unity gain buffer 49 and to one terminal of a resistor R16 having its other terminal connected to conductor 51. Conductor 51 is coupled to the (+) terminal of a level shift circuit VB1 having its (−) terminal connected to VEE. Conductor 47 also is connected to a bias current source I3.

Thus, the same input signal Vin which appears at the differential inputs of operational amplifier input stage 20 is also applied to the bases of transistors Q30, Q17, Q18, and Q31 in detector circuit 60 of FIG. 5, so that transistors Q30 and Q31 both are on during small-signal operation and therefore conduct tail currents I1 and I2, respectively. Preferably, tail currents I1 and I2 and a bias current I3 each have a value Iswitch. Then, for small-signal operation, a current equal to 2*Iswitch from tail current sources I1 and I2 is sourced into resistor R16, and a value Iswitch from bias current source I3 is subtracted from 2*Iswitch. The result is that resistor R16 has a net current equal to Iswitch and the current in resistor R15 is zero. This causes VBmain to be at a higher level than VBalt because no current flows through resistor R15 and consequently no voltage is developed across it.

Either transistor Q17 or transistor Q18 will also start conducting current when the value of the voltage Vin=Vin+−Vin− approaches the value of the turn-on voltage of diodes D6 and D7. This input voltage difference for switching threshold voltage, which roughly determines the onset of "large-signal" conditions, is somewhat arbitrary and could be set to various different values by minor circuit design modifications, as subsequently explained.

Under large-signal conditions, transistors Q17, Q18, Q30 and Q31 all are on if either Vin+>>Vin− or if Vin+<<Vin−. That is, if the magnitude of Vin=(Vin− minus Vin+) exceeds a particular threshold voltage, the value of tail current source I1 or I2 is sourced and the value of bias current source I3 is subtracted from it, and resistor R15 receives a current of value Iswitch (from either tail current source I1 or I2) while resistor R16 receives a net current of 0. Therefore, during large-signal conditions VBalt is at a higher value than VBmain, so alternative input circuitry 20B "takes over" the amplification of Vin from main input circuitry 20A, and main input circuitry 20A is shut down and therefore remains in a thermally balanced condition, and the thermal recovery tail will be short.

The "on" voltage of diodes D6 and D7 is approximately 0.4 volts for a typical semiconductor manufacturing process, and that "on" voltage establishes the threshold for determining whether the differential input voltage Vin is a "high-level" signal. By "stacking" one or more additional diodes (not shown), in series with each of diodes D6 and D7, the threshold beyond which Vin is considered to be a "high-level" signal can be proportionately increased. For smoother switching between main input circuitry 20A and alternative input circuitry 20B, diodes D6 and D7 can be replaced by optional resistors as shown by the dashed lines in FIG. 5, and the current through the optional resistors, multiplied by their respective resistances, establishes the threshold for the switching from main input circuitry 20A to alternative input circuitry 20B.

Figure 6:
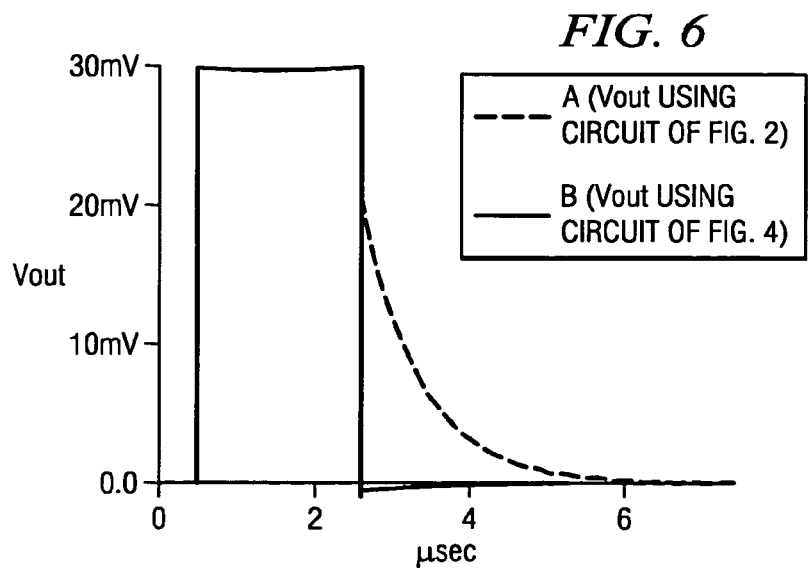
FIG. 6 is a diagram illustrating waveforms showing recovery of Vout for the prior art circuit of FIG. 2 and the circuit of the present invention as shown in FIG. 4.
Figure 7:
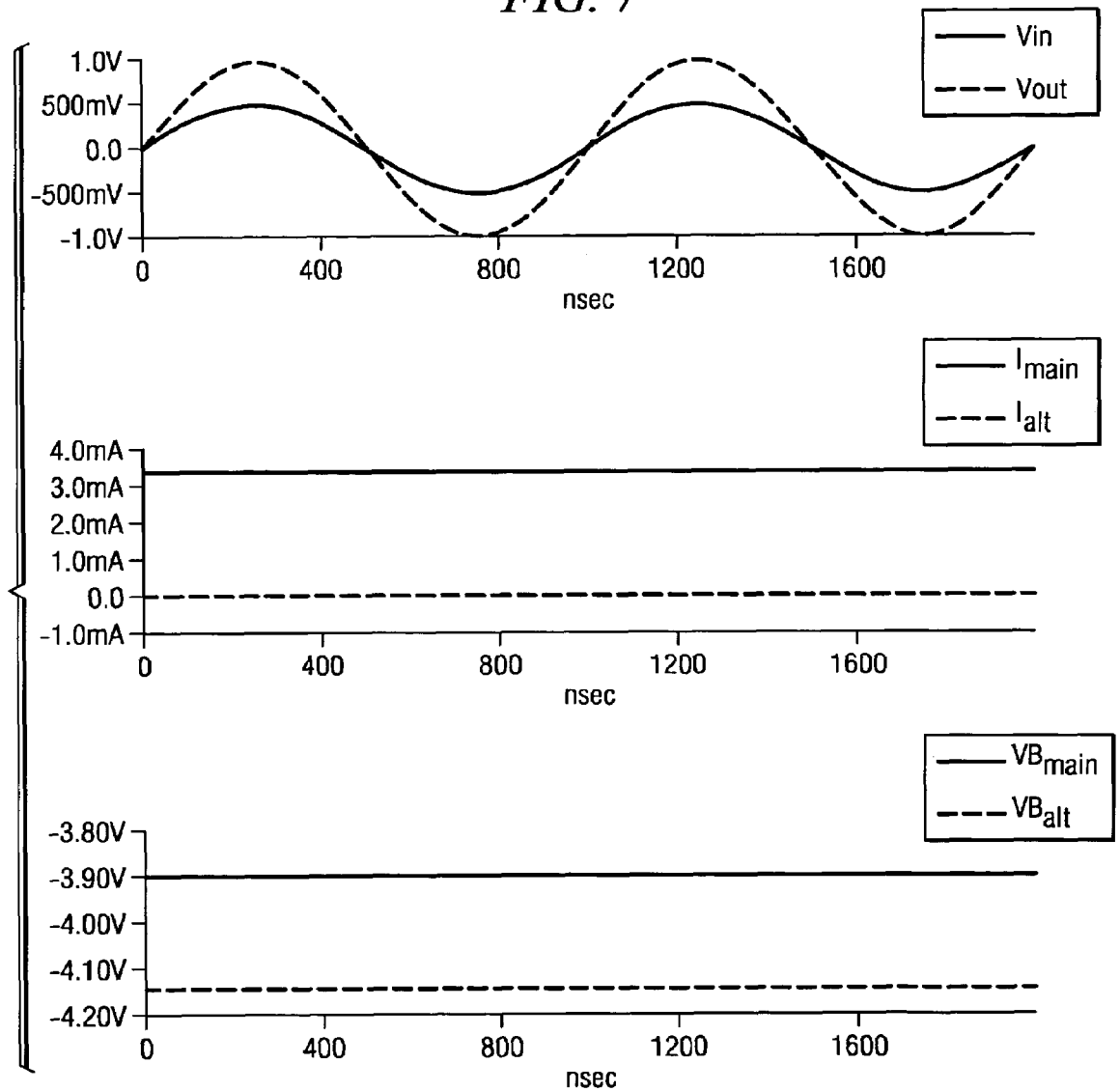
FIG. 7 is a diagram showing waveforms of Vin and Vout for the circuit of FIG. 4 under small-signal conditions which do not cause switching of the folded cascode input stage.

The above described embodiment of the invention avoids the previously described thermal imbalance effects that otherwise would occur during low-level Vin conditions in main input circuitry 20A by switching the Vin signal path through alternative input stage 20B any time operating conditions would cause thermal imbalance in the main input circuitry 20A. For example, simulated waveform "B" in FIG. 6 shows substantially reduced improved time for thermal recovery of the disturbance of Vout of the circuit of FIG. 4 caused by a particular simulated large thermal imbalance, compared to the much longer corresponding thermal recovery time and much larger magnitude of disturbance for the prior art circuit of FIG. 2. Also, the magnitude of the disturbance of Vout caused by the large thermal imbalance is much lower than that for the prior art circuit of FIG. 2. FIG. 7 shows simulated waveforms of VBmain and VBalt for normal small-signal operation wherein no input stage switching occurs. FIG. 8 shows simulated waveforms for large-signal operation wherein input stage switching does occur.

Figure 1:
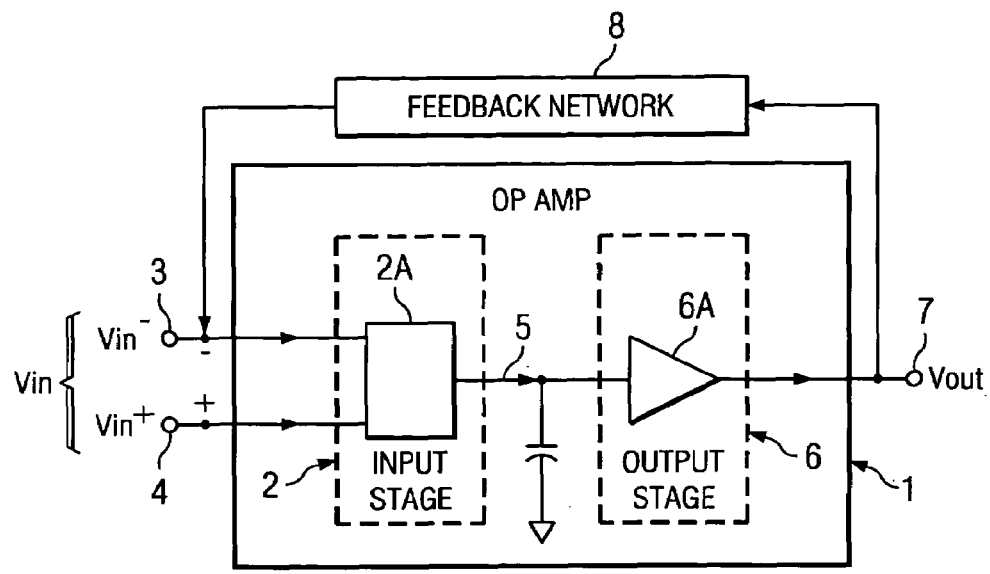
FIG. 1 is a block diagram of a conventional feedback amplifier.

An analysis has been performed to compare the harmonic distortion of the circuit of FIG. 4 associated with the circuit of prior art FIG. 1,2 with the harmonic distortion of switched differential input circuit of FIG. 4 including the switched folded cascode circuit 200B. The results of that analysis indicate that the difference in harmonic distortion between the prior art circuit of FIGS. 1,2 and the circuit of FIGS. 3,4 is insignificant over the range of frequencies of interest. Specifically, in each case the harmonic distortion is below −65 dB in the range between 1 MHz and 7 MHz.

Figure 9A:
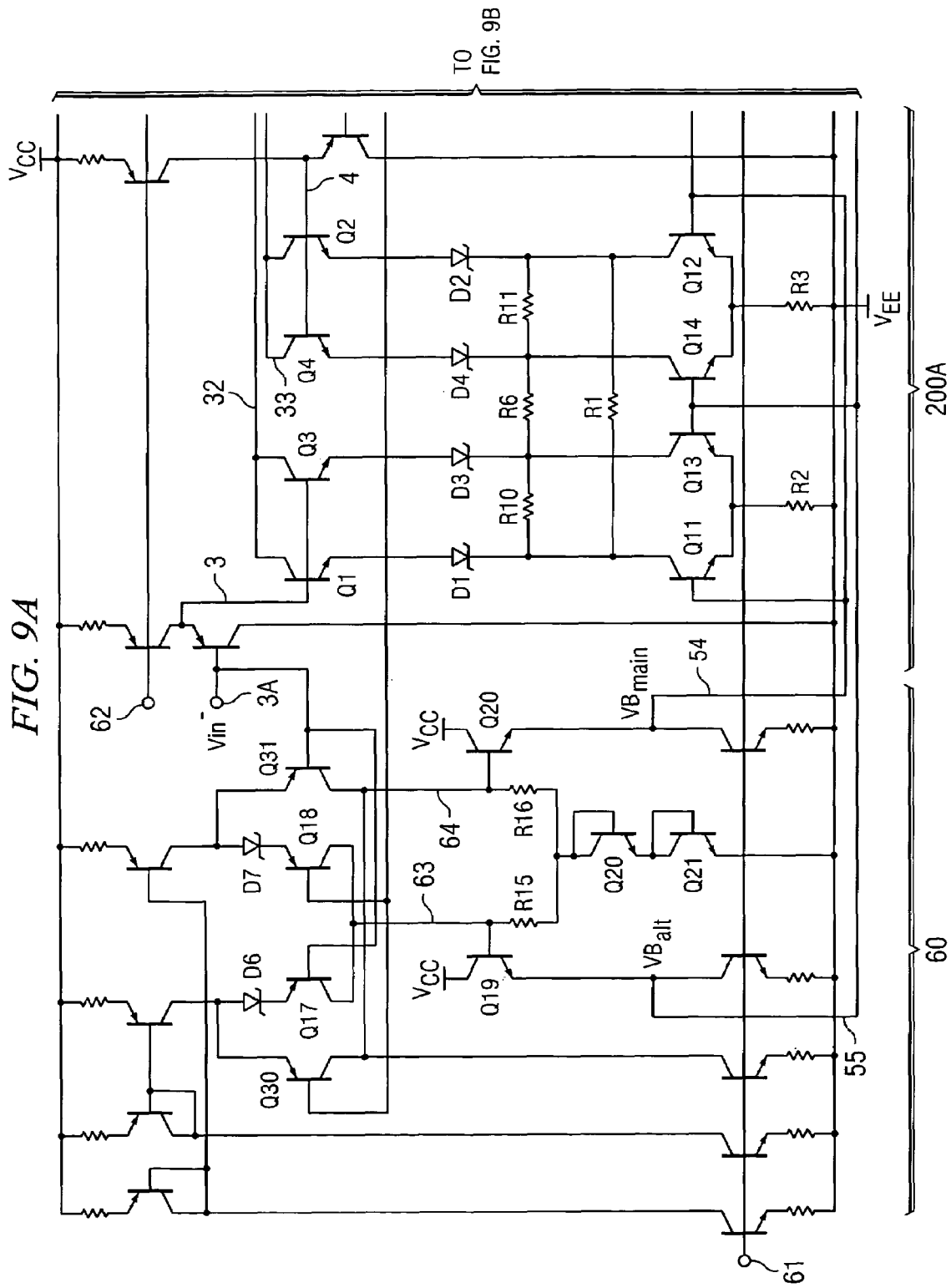
FIGS. 9A and 9B constitute a detailed schematic diagram illustrating a preferred implementation of the circuit of FIG. 4 and FIG. 5.
Figure 9B:
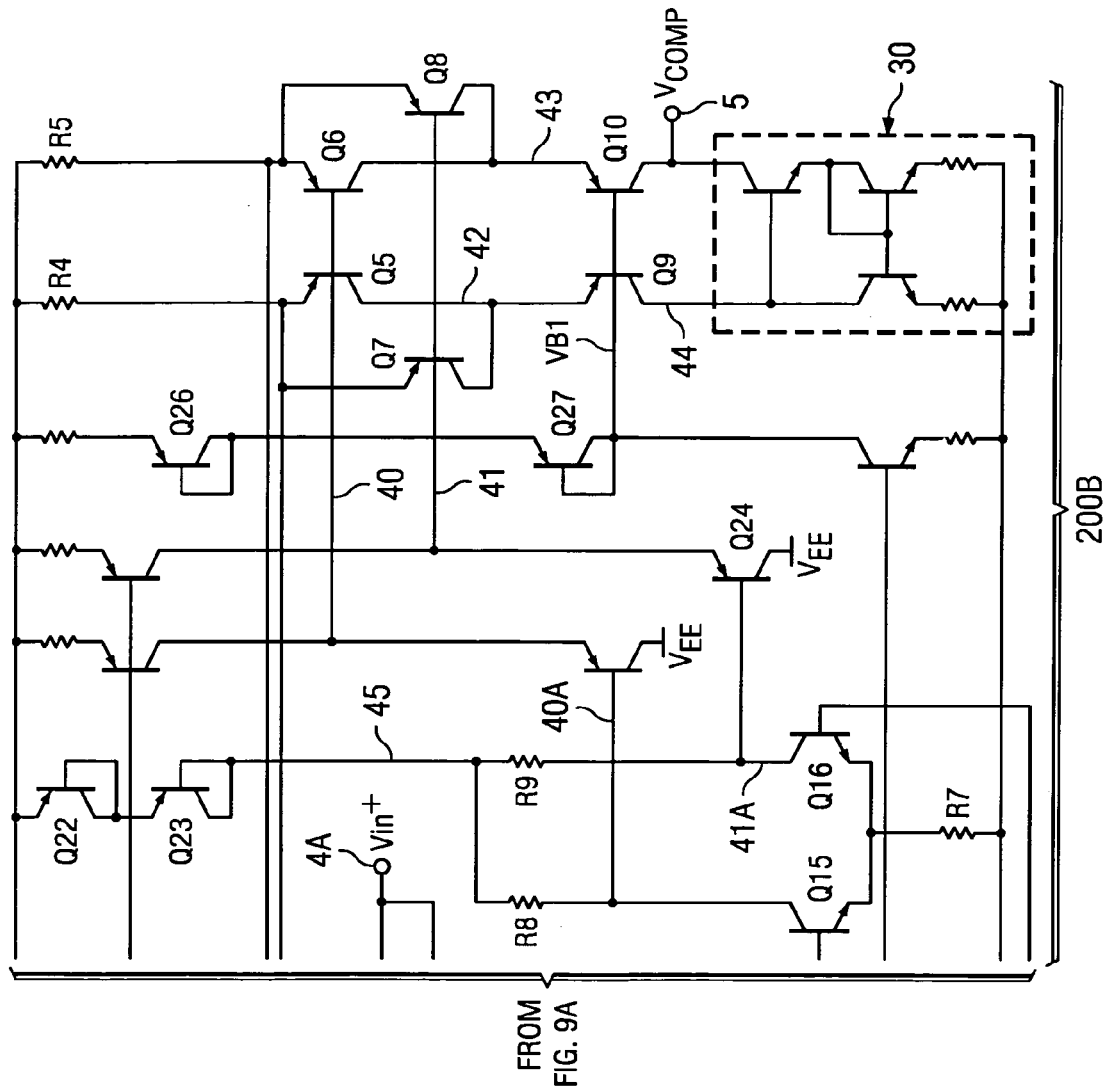

FIGS. 9A and 9B include a somewhat more detailed implementation of the above described circuitry of FIGS. 4 and 5, with corresponding reference characters, wherein specific implementations of voltage sources VB1, VB2, buffers 49 and 50, and various current sources and current mirror circuits are shown.

It should be appreciated that the input stage of above described operational amplifier 10 can be different Vin the one illustrated in FIG. 4. For example, rather than using cascode stage 200B as shown in FIG. 4, another differential stage could be used having its inputs connected to the outputs of the differential stage 200A.

It should also be appreciated that there would be an advantage to using the switching technique between main and alternative signal path stages in either the differential input stage 200A alone or cascode stage 200B alone, although the advantage would be less than using the above described Vin signal path switching technique in both. Also, those skilled in the art will recognize that the more gain there is in the signal path ahead of a point at which the technique of switching the signal path between a main circuit is utilized during small-signal conditions and another high-power path is utilized during large-signal conditions, the less advantage will be achieved from the switching; this is because the gain is "referred back" to the input of the operational amplifier. Consequently, it is usually more advantageous to use the technique of the present invention closer to the amplifier input than to the amplifier output. Also, it should be noted that the thermal imbalance anywhere in the signal path of Vin can be reduced by reducing the collector-emitter voltages of transistors in that signal path.

By way of definition, the term "differential" as used herein to describe, for example, a differential input stage or a differential signal, is not intended to be limited to the generally "symmetrical" circuit configurations illustrated herein. It is intended that the term "differential signal" encompass any signal that is referenced to another time-variable signal or to a fixed referenced signal such as ground (as indicated by the dashed line connected to Vin− shown in FIG. 3), and that the term "differential" can be used to refer to any circuit providing a signal path for such a differential signal.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. An amplifier comprising:
   (a) an input stage for amplifying signals in a signal path of a differential input signal, and an output stage coupled to a signal path of the input stage for producing an output signal;
   (b) the input stage including main input circuitry for amplifying relatively small-value signals in the signal path of the differential input signal, the input stage also including alternative input circuitry for amplifying signals in the signal path of the differential input signal during a condition which otherwise would cause thermal imbalance in the main input circuitry; and
   (c) the input stage including switching circuitry for coupling signals in the signal path of the differential input signal to the main input circuitry during normal small-signal operating conditions and for coupling signals in the signal path of the input signal to the alternative input circuitry during the condition which otherwise would cause thermal imbalance in the main input circuitry.

2. An amplifier comprising:
   (a) an input stage for amplifying a differential input signal and an output stage coupled to the input stage for producing an output signal, the input stage including at least a first stage coupled to a signal path of the differential input signal;
   (b) the input stage including main input circuitry including a first portion of the first stage for amplifying relatively small-value signals in the signal path of the differential input signal, the input stage also including alternative input circuitry including a second portion of the first stage for amplifying relatively large-value signals in the signal path of the differential input signal which if amplified by the main input circuitry would cause thermal imbalance in the main input circuitry; and
   (c) the input stage including switching circuitry for selectively coupling signals in the signal path of the differential input signal to the first portion of the first stage or the second portion of the first stage, and also including detection circuitry coupled to receive signals in the signal path of the differential input signal, the detection circuitry being coupled to the first portion of the first stage to cause the first portion of the first stage to amplify signals in the signal path of the differential input signal during small-signal operating conditions, the detection circuitry being coupled to the second portion of the first stage to cause the second portion of the first stage to amplify signals in the signal path of the differential input signal during large-signal operating conditions to reduce thermal imbalance in the main input circuitry.

3. The amplifier of claim 2 wherein the input stage also includes a second stage coupled in the path of the differential input signal, wherein the main circuitry includes a first portion of the second stage for amplifying relatively small-value signals in the signal path of the differential input signal, wherein the alternative circuitry includes a second portion of the second stage for amplifying relatively large-value signals in the signal path of the differential input signal, wherein the detection circuitry is coupled to the first portion of the second stage to cause the first portion of the second stage to amplify signals in the signal path of the differential input signal during small-signal operating conditions, and wherein the detection circuitry is coupled to the second portion of the second stage to cause the second portion of the second stage to amplify signals in the signal path of the differential input signal during large-signal operating conditions to further reduce thermal imbalance in the main input circuitry.

4. The amplifier of claim 2 wherein the first stage includes a differential input stage coupled to receive the differential input signal.

5. The amplifier of claim 2 wherein the first stage includes a differential cascode stage coupled to receive signals in the signal path of the differential input signal.

6. The amplifier of claim 2 wherein the first stage includes a differential input stage coupled to receive the differential input signal and wherein a second stage includes a differential cascode stage coupled to receive signals in the signal path of the differential input signal.

7. The amplifier of claim 2 including a feedback network coupled between the output signal and an input of the input stage.

8. The amplifier of claim 7 wherein the input to which the feedback network is coupled is an inverting input.

9. The amplifier of claim 2 wherein the differential input signal is equal to the difference between first and second time-varying signals.

10. The amplifier of claim 2 wherein the differential input signal is equal to the difference between a first time-varying signal and a fixed reference signal.

11. The amplifier of claim 2 wherein the detection circuitry is operative to produce a control signal indicative of whether the differential input signal is a relatively small-value signal or a relatively large-value signal.

12. The amplifier of claim 2 wherein the detection circuitry is operative to produce a first control signal indicative of when the differential input signal is a relatively small-value signal for controlling the first portion of the first stage and a second control signal indicative of when the differential input signal is a relatively large-value signal for controlling the second portion of the first stage.

13. The amplifier of claim 2 wherein the switching circuitry decouples the input signal from a first one of the main input circuitry and the alternative input circuitry while coupling the input signal to the other of the main input circuitry and the alternative input circuitry.

14. The amplifier of claim 7 wherein occurrence of the relatively large-value signal is caused by an interruption in a feedback loop of the amplifier.

15. The amplifier of claim 2 wherein the input stage includes a switched differential amplifier section including first, second, third and fourth input transistors, and first, second, third and fourth switching transistors, collectors of the first and third input transistors being coupled by a first conductor to a first terminal of a first load device, collectors of the second and fourth being coupled by a second conductor to a first terminal of a second load device, bases of the first and third input transistors being coupled to a first input signal, bases of the second and fourth input transistors being coupled to a second input signal, an emitter of the first input transistor being coupled by a first diode to a collector of the first switching transistor, an emitter of the second input transistor being coupled by a second diode to a collector of the second switching transistor, an emitter of the third input transistor being coupled by a third diode to a collector of the third switching transistor, an emitter of the fourth input transistor being coupled by a fourth diode to a collector of the fourth switching transistor, emitters of the first and third switching transistors being coupled to a first terminal of a first current source, and emitters of the second and fourth switching transistors being coupled to a first terminal of a second current source, a first emitter degeneration resistor being coupled between the emitters of the first and second input transistors, a second emitter degeneration resistor being coupled between the emitters of the third and fourth input transistors, bases of the first, second, third and fourth switching transistors being coupled to the switching circuitry.

16. The amplifier of claim 15 wherein the first emitter degeneration resistor is coupled between cathodes of the first and second diodes and between collectors of the first and second switching transistors, and wherein the second emitter degeneration resistor is coupled between cathodes of the third and fourth diodes and between the collectors of the third and fourth switching transistors.

17. The amplifier of claim 16 including a first resistor coupled between an anode of the first diode and the cathode of the third diode, and also including a second resistor is coupled between an anode of the second diode and the cathode of the fourth diode.

18. The amplifier of claim 17 wherein bases of the first, second, third, and fourth switching transistors are coupled to the switching circuitry to turn the first and second switching transistors on during the normal small-signal operating conditions and to turn the third and fourth switching transistors on during the condition which causes the thermal imbalance.

19. The amplifier of claim 18 wherein the detection circuitry is operative to produce a first control signal indicative of when the differential input signal is a relatively small-value signal for controlling the first portion of the first stage and a second control signal indicative of when the differential input signal is a relatively large-value signal for controlling the second portion of the first stage, the first control signal being coupled to the bases of the first and second switching transistors, the second control signal being coupled to the bases of the third and fourth switching transistors.

20. The amplifier of claim 2 wherein the input stage includes a switched folded cascode section including a first main cascode transistor having a collector coupled to an output of a current mirror and a base coupled to the switching circuitry, a second main cascode transistor having a collector coupled to an input of the current mirror and a base coupled to the switching circuitry, a first alternate cascode transistor having a collector coupled to the collector of the first main cascode transistor and a base coupled to the switching circuitry, and a second alternate cascode transistor having a collector coupled to the collector of the second main cascode transistor and a base coupled to the switching circuitry.

21. The amplifier of claim 20 wherein the collector of the first main cascode transistor is coupled to the output of the current mirror by means of a first series cascode transistor and the collector of the second main cascode transistor is coupled to the input of the current mirror by means of a second series cascode transistor.

22. The amplifier of claim 20 wherein bases of the first and second main cascode transistors are coupled to the switching circuitry to turn them on during the small-signal operating conditions and wherein bases of the first and second alternative cascode transistors are coupled to the switching circuitry to turn them on during the large-signal operating conditions.

23. The amplifier of claim 2 wherein the detection circuitry includes
a first detector input stage including a first detector input transistor having a first terminal coupled to a first current source, a control terminal coupled to a first input conductor, and a second terminal coupled to a first conductor, a second detector input transistor having a first terminal coupled to a first terminal of a first detector diode having a second terminal coupled to the first current source, a control terminal coupled to a second input conductor, and a second terminal coupled to a second conductor;
a second detector input stage including a third detector input transistor having a first terminal coupled to a second current source, a control terminal coupled to the second input conductor, and a second terminal coupled to the first conductor, a fourth detector input transistor having a first terminal coupled to a first terminal of a second detector diode having a second terminal coupled to the second current source, a control terminal coupled to the first input conductor, and a second terminal coupled to the second conductor; and
a detector output stage including a third current source coupled to the first conductor, a first detector resistor having a first terminal coupled to the second conductor and a second terminal coupled to a reference voltage source, and a second detector resistor having a first terminal coupled to the first conductor and a second terminal coupled to the reference voltage source, the first conductor being coupled to the first portion of the first stage and conducting a signal for indicating that the differential input signal has a small-signal value, the second conductor being coupled to the second portion of the first stage and conducting a signal for indicating that the differential input signal has a large-signal value.

24. The amplifier of claim 15 wherein the input stage also includes a switched folded cascode section including a first main cascode transistor having a collector coupled to an output of a current mirror and a base coupled to the switching circuitry, a second main cascode transistor having a collector coupled to an input of the current mirror and a base coupled to the switching circuitry, a first alternate cascode transistor having a collector coupled to the collector of the first main cascode transistor and a base coupled to the switching circuitry, and a second alternate cascode transistor having a collector coupled to the collector of the second main cascode transistor and a base coupled to the switching circuitry.

25. The amplifier of claim 24 wherein the collector of the first main cascode transistor is coupled to the output of the current mirror by means of a first series cascode transistor and the collector of the second main cascode transistor is coupled to the input of the current mirror by means of a second series cascode transistor.

26. A method of reducing thermal imbalance in an amplifier including a differential amplifier having an input stage for amplifying a signal in the path of a differential input signal, and an output stage coupled to the input stage for producing and output signal and a feedback network to coupled between the output signal and an inverting input of the input stage, the method comprising:

(a) providing main input circuitry in the input stage for amplifying small-signal values of the input signal and also providing alternative input circuitry in the input stage for amplifying the input signal during a condition which otherwise would cause thermal imbalance in the main input circuitry;

(b) coupling the input signal to the main input circuitry during normal small-signal operating conditions; and (c) coupling the input signal to the alternative input circuitry during the condition which otherwise would cause thermal imbalance in the main input circuitry.

27. A method of reducing thermal imbalance in an amplifier including a differential amplifier having an input stage for amplifying signals in a signal path of a differential input signal, and an output stage coupled to the input stage for producing an output signal, the method comprising:

(a) providing main input circuitry in the input stage for amplifying relatively small-value signals in the signal path of the differential input signal, and also providing alternative input circuitry in the input stage for amplifying signals in the signal path of the differential input signal during a condition which otherwise would cause thermal imbalance in the main input circuitry;

(b) coupling the main input circuitry to the signal path of the differential input signal to during the relatively small-value signal operating conditions;

(C) decoupling the main input circuitry from the differential input signal during the condition which otherwise would cause a thermal imbalance in the main input circuitry; and (d) coupling the alternative input circuitry to the path of the differential input signal during the condition to cause the thermal imbalance to occur in the alternative input circuitry instead of the main input circuitry.

28. An amplifier comprising:

(a) an input stage for amplifying a differential input signal, and an output stage coupled to the input stage for producing an output signal;

(b) main input circuitry in the input stage for amplifying relatively small-value signals in a signal path of the input signal, and alternative input circuitry in the input stage for amplifying signals in the signal path of the input signal during a condition which would otherwise cause thermal imbalance in the main input circuitry;

(c) means for reducing thermal imbalance in the main input circuitry by coupling the relatively small-value signals in the signal path of the input signal to the main input circuitry during small-signal operating conditions and decoupling the relatively small-value signals in the signal path of the input signal from the main input circuitry during the condition which would otherwise cause thermal imbalance in the main input circuitry; and (d) means for coupling the differential input signal to the alternative input circuitry to cause the thermal imbalance to occur in the alternative input circuitry instead of the main input circuitry.

* * * * *